United States Patent [19]
Hrovat

[11] Patent Number: 5,751,146
[45] Date of Patent: May 12, 1998

[54] SURFACE COIL FOR HIGH RESOLUTION IMAGING

[75] Inventor: Mirko I. Hrovat, Brockton, Mass.

[73] Assignee: Magnetic Vision Technologies, Inc., Cambridge, Mass.

[21] Appl. No.: 754,745

[22] Filed: Nov. 21, 1996

Related U.S. Application Data

[63] Continuation of Ser. No. 347,799, Dec. 1, 1994, abandoned.

[51] Int. Cl.$^6$ ................................................. G01R 33/20
[52] U.S. Cl. ................................................. 324/318
[58] Field of Search ...................... 324/318, 322, 324/316, 300, 314; 128/653.5; 335/296, 299; 333/219

[56] References Cited

U.S. PATENT DOCUMENTS

| | | | |
|---|---|---|---|
| 4,128,814 | 12/1978 | Reinhardt et al. | 324/307 |
| 4,435,680 | 3/1984 | Froncisz et al. | 324/318 |
| 4,617,936 | 10/1986 | Malko | 128/653 |
| 4,620,155 | 10/1986 | Edelstein | 324/322 |
| 4,680,549 | 7/1987 | Tanttu | 324/318 |
| 4,717,880 | 1/1988 | Ono et al. | 324/318 |
| 4,724,389 | 2/1988 | Hyde et al. | 324/316 |
| 4,734,647 | 3/1988 | Yoshimura | 324/318 |
| 4,739,269 | 4/1988 | Kopp | 324/318 |
| 4,758,789 | 7/1988 | Ono et al. | 324/318 |
| 4,785,246 | 11/1988 | Sugimoto | 324/322 |
| 4,799,016 | 1/1989 | Rezvani | 324/318 |
| 4,839,595 | 6/1989 | Boskamp | 324/318 |
| 4,841,249 | 6/1989 | Duerr et al. | 324/318 |
| 4,885,539 | 12/1989 | Roemer et al. | 324/318 |
| 4,916,399 | 4/1990 | Oliver | 324/318 |
| 4,972,836 | 11/1990 | Schenck et al. | 128/653 |
| 5,050,605 | 9/1991 | Eydelman et al. | 324/318 |
| 5,139,024 | 8/1992 | Bryant et al. | 324/318 |
| 5,201,312 | 4/1993 | Schenck et al. | 324/318 |
| 5,216,367 | 6/1993 | Mori | 324/318 |
| 5,363,845 | 11/1994 | Chowdhury et al. | 324/318 |
| 5,422,578 | 6/1995 | Hoegler | 324/318 |
| 5,435,302 | 7/1995 | Lenkinski | 324/322 |

OTHER PUBLICATIONS

Journal of Magnetic Resonance, vol. 68, pp. 556–560 (1986).

Primary Examiner—Sandra L. O'Shea
Assistant Examiner—Raymond Y. Mah
Attorney, Agent, or Firm—George W. Neuner

[57] ABSTRACT

An rf surface coil for MRI is described. The surface coil is made of a trace of a high conductivity material having a length, width and thickness and having a surface defined by the length and the width. The coil has a radius and a longitudinal axis at the center of the coil. The trace is arranged in a loop with one end in proximity to the other end with the surface facing the inside of the loop, wherein the surface is substantially parallel to the longitudinal axis of the coil. The ratio of the width of the coil to the radius of the coil is 0.3 or greater and the thickness of the trace is sufficient to provide an rf skin effect. Circuit designs for inductively coupling the decoupling the surface coil from a volume coil during rf excitation are also described.

7 Claims, 4 Drawing Sheets

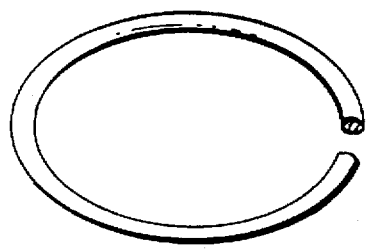
FIG. 1A PRIOR ART
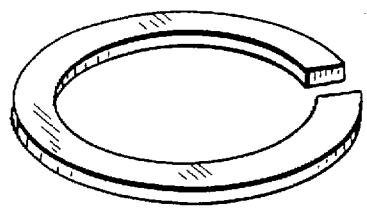
FIG. 1B PRIOR ART
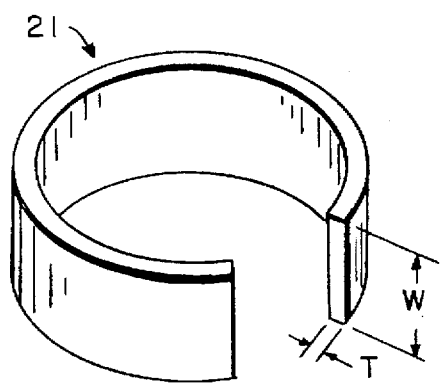
FIG. 2A
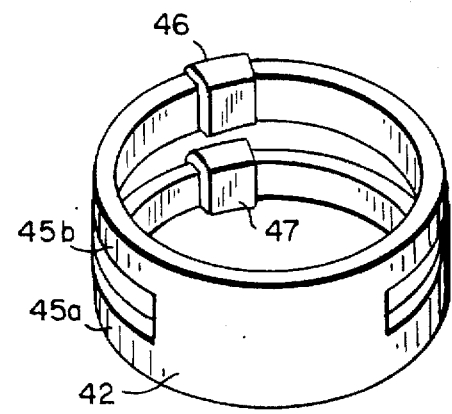
FIG. 4
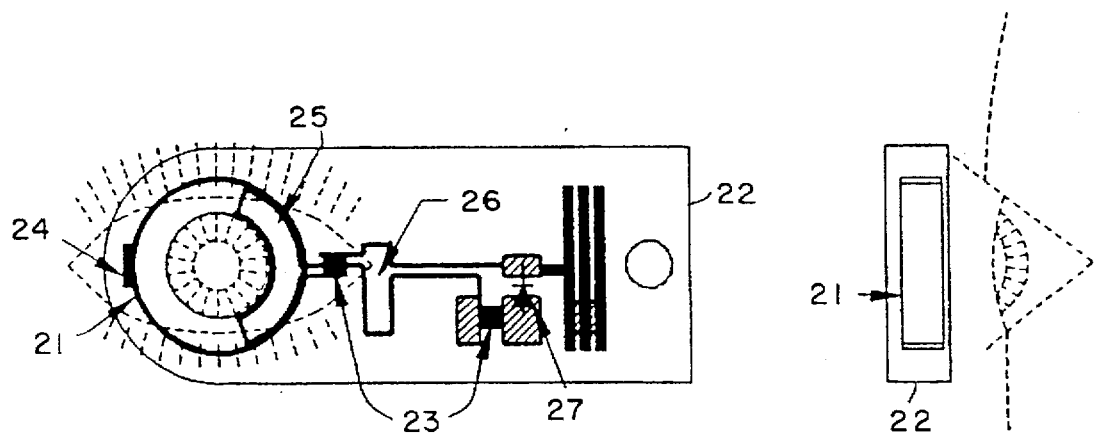
FIG. 2B
FIG. 2C

SURFACE COIL FOR HIGH RESOLUTION IMAGING

This application is a continuation of application Ser. No. 08/347,799 filed on Dec. 1, 1994 (now abandoned).

FIELD OF THE INVENTION

The present invention relates to an apparatus for performing magnetic resonance imaging (MRI) and, more particularly, to surface coils for detecting nuclear magnetic resonance (NMR) signals for high resolution imaging.

BACKGROUND OF THE INVENTION

In an MRI device, an object to be examined is subjected to a constant uniform magnetic field, $B_o$, which is applied typically along the z-axis of a Cartesian coordinate system. The origin of this system is normally considered to lie within the object. Under the influence of this field, magnetic moments of particles within the object are on average aligned with this field and undergo precession about the z-axis at their respective Larmor frequencies which is given by $\omega = \gamma B_o$, where $\omega$ is the Larmor frequency and gamma is the gyromagnetic ratio which is constant and a property of the particular magnetic moment of the particle. In a typical MRI system with a magnetic field $B_o$ of 1.5 Tesla, hydrogen nuclei (for example, as found in water and fat) resonate at a frequency of approximately 63.86 MHz which is in the radio frequency (rf) band of the electromagnetic spectrum.

In a typical NMR sequence, an rf magnetic field oscillating at the appropriate Larmor frequency is applied to the object to be examined. After excitation, a measurement is performed on the rf resonance signal induced by the nuclei when their magnetic moments precess within the volume of the detecting rf coil. The detection coil may or may not be the same coil as employed for excitation. The measured signal can be processed in order to extract therefrom additional data such as cross-sectional images of tissues or organs under examination or spectroscopic data associated with nuclei in different chemical and/or magnetic environments.

Apparatus that uses NMR phenomena to measure and produce images in body tissue is well known and has been described, for example, in the book, *NMR Imaging in Medicine*, P. Mansfield and P. G. Morris, *Advances in Magnetic Resonance*, Supplement 2, Academic Press, New York (1982). Such apparatus usually includes a magnet system for generating a large, homogeneous magnetic field in conjunction with a plurality of smaller gradient magnetic fields, means for generating an oscillating radio frequency magnetic field for excitation of the NMR phenomena within the object, and means for detecting magnetic resonance signals which are generated within the object.

In such apparatus, it has become common to use a first large rf coil (volume coil) to generate the exciting rf magnetic field and a second, smaller coil, often called a "surface coil", to detect resonance signals in a localized volume of the object which is undergoing examination. Apparatus of this type is described in *Computer Tomography*, 1, 1981, pp. 2–10 and at chapter 8, page 164 of the book *Nuclear Magnetic Resonance and its Applications to Living Systems*, D. G. Gadian, Clarendon Press Oxford (1982) which describes the advantages of using surface coils for bloodstream measurements.

Surface coils are used in NMR spectroscopy and MRI to provide higher resolution and a better SNR (Signal-to-Noise Ratio) than that obtained by the normal volume rf coils. The best SNR is achieved by tailoring the size of the detection coil to the region of interest. Hence, a variety of coils may be employed. These coils may be categorized as to their type, (volume or surface), their typical anatomical application (for example eye, spinal, knee, etc.), or their shape and size. Volume coils generally consist of an arrangement of electrical conductor which surrounds the sample object. On the other hand, surface coils consist of a conductor arrangement which is on one side of the sample object and, hence, can be placed adjacent to the surface of the object.

High-contrast MRI of the human eye is possible. However, diagnosis of eye diseases by the use of MRI has not been practiced due to certain technical limitations and, thus, radiologists typically continue to use computed tomography or ultrasound examinations for eye studies in cases where MRI can provide a higher contrast and more detailed image. In addition to the higher image quality potentially offered by MRI examinations, it is known that the x-ray dosage attendant to computerized tomography scanning is sufficiently large so that, in most cases, follow-up studies on any given patient are precluded. Conversely, MRI studies appear to be repeatable as often as necessary for a given patient. Although repeatable, sonograms are highly operator dependent and susceptible to significant artifacts.

Accordingly, it is highly desirable to overcome the present technical limitations for NMR imaging of the human eye. Present sensitivity and signal-to-noise ratio characteristics of the receiver coil should be increased to permit rapid high-resolution imaging of small structures, such as the lens and the like, within the eye. Any receiver coil utilized for eye imaging should avoid the hitherto-encountered difficulties in awkwardness in placement of such reception coils in position over the eye and in maintenance in the placed position, even while being more easily tolerated by the patient during the MRI scanning process. Accordingly, reception coils of sufficiently high sensitivity, ease of placement and support, and patient tolerance, are highly desirable.

SUMMARY OF THE INVENTION

In accord with the present invention, a high resolution surface coil is provided for MRI. The surface coil of the present invention comprises a trace or ribbon of a high conductivity material having a predetermined length, width, and thickness wherein the length of the material is arranged in a loop or coil shape with one end in proximity to or adjacent to the other end, and having a surface defined by the length and width of the coil, wherein the surface is oriented (or facing) toward the interior of the coil, i.e., the surface of the coil is substantially parallel to the longitudinal axis of the coil. The thickness is of a sufficient dimension so as to not add substantially to the electrical resistance at the frequency of operation. The thickness is determined by the rf skin depth which is readily determined by those skilled in the art by the resistivity and magnetic permeability of the conductor and the frequency at which it is operated. Generally, it is considered that the total resistance of the conductor is determined within about 3 to 5 skin depth thicknesses from the surface of the conductor. Thus, a thickness greater than 3 to 5 skin depth thicknesses will not significantly reduce the rf resistance of the conductor. Preferably, the ratio ("W/R") of the width W of the trace or ribbon to the radius of the surface coil is 0.3 or greater, more preferably the ratio W/R is 0.5 or greater.

As used herein, the terms "coil" and "loop" are meant to include any shape that can be formed having one end of a linear segment adjacent the other end such as, for example, circular, elliptical, rectangular, square, etc. The surface coil can be mounted on any suitable substrate for convenience in handling and positioning. Suitable substrates are materials that are nonconductive and non-magnetic.

In another embodiment of this invention, a circuit is provided for decoupling the surface coil from a volume coil (for example a whole body coil) or other surface coil that used to excite an NMR signal from the object being imaged. Thus, in an MRI system using a whole body coil to excite an NMR signal and using an rf surface coil to detect the NMR signal, the invention further provides, for example, a matching network circuit that inductively couples an active decoupling effect to the surface coil.

Thus, in accord with a preferred embodiment of the invention, a surface coil circuit comprises a first coil comprising a loop formed of a conductor material for detecting NMR signals, a matching circuit comprising a second coil formed of a conductor material and inductively coupled to said fist coil during rf excitation of an object, which is the matching circuit during excitation. Preferably, the second coil comprises two loops, one located inside the loop of the first coil, the second located outside the loop of the first coil, e.g., in a figure eight pattern. In a preferred embodiment, the area of the two loops are equal so as to appear electrically transparent to an external excitation coil. In another embodiment, the two loops have unequal areas which are adjusted so that the surface coil exhibits a net decoupling effect with respect to the external excitation coil.

For purposes of the present invention, the conductor material has high electrical conductivity such as, for example, copper, silver, superconducting materials, and the like.

BRIEF DESCRIPTION OF THE DRAWINGS

FIGS. 1A and 1B are isometric views illustrating typical conductor arrangements that have been employed in surface coil designs; FIG. 1A illustrates a loop of copper wire and FIG. 1B illustrates a trace of copper in the form of a loop wherein the thickness dimension is significantly less than the dimension of the annular surface.

FIG. 2A is an isometric view illustrating a surface coil in accord with the present invention, for example, for imaging of the eye, wherein W is significantly greater than T; FIG. 2B illustrates a plan view illustrating a surface coil in accord with the present invention, along with its associated circuitry on a support, positioned over an eye; and FIG. 2C illustrates a side view of the surface coil and eye shown in FIG. 2B.

FIG. 4 is an isometric view illustrating a double resonant ribbon surface coil in accord with an embodiment of the present invention.

DETAILED DESCRIPTION OF THE INVENTION INCLUDING THE PREFERRED EMBODIMENTS

Figure 3A:
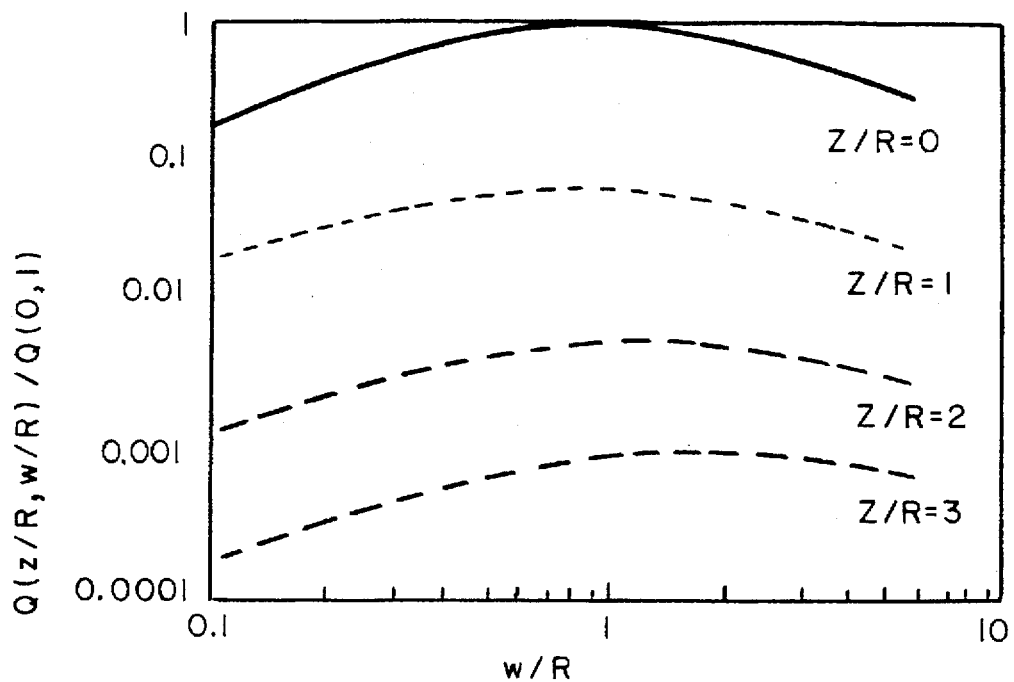
FIG. 3A is a graph illustrating the localized Q(z/R,w/R) /Q(0,1) for a ribbon coil as a function of the width of the coil.

In accord with the present invention a surface coil is formed by providing a trace of conductor material such as copper in the form of a loop as illustrated in FIG. 2A. Conveniently, the conductor material is formed on a suitable substrate using conventional circuit board manufacturing technology. The substrate is preferably a material that is non-magnetic and electrically insulating. The trace is formed in a rectangular shape or ribbon of length "L" and width "W", and has a sufficient thickness "T" to provide minimum resistivity. The substrate with the trace formed thereon can be formed into a loop having any desired shape, e.g. circular, as illustrated in FIG. 2A.

The length and width of the trace are determined to provide the desired cross-sectional area inside the loop of the surface coil. In turn, the cross-sectional area is determined by the desired region of interest in the object to be examined. The thickness or depth of the trace is sufficient to provide an effective rf skin. Typically, the rf skin depth at 63.9 MHz for copper is calculated to be about 0.325 mils. The thickness of the trace used to make the coils of the present invention is at least 3 to 5 times the rf skin depth, which is typically considered sufficient to provide an effective rf skin with minimal electrical resistance due to the conductor. Thicknesses greater than this value will not significantly reduce the electrical resistance due to the conductor material. Thus, for copper, it is preferred that the thickness of the coil be at least about 0.975 mils (1 mil= 0.001 inch).

The width is typically determined to provide a value equal to or better than the Q value of a conventional wire loop where Q is the ratio of (i) the stored power in the magnetic field to (ii) the dissipative power in the resistance. In accord with the present invention, the width of the coil preferably is at least 0.3 times the radius of the coil, more preferably at least 0.5 times the radius. Most preferably, the width is about equal to the radius of the coil, i.e., a ratio of about 1. If the coil is not circular, its equivalent radius is used. For imaging of the eye, a coil radius of from about 1.0 cm to about 2.5 cm is preferred.

Surface coils made in accord with the present invention provide high resolution images for MRI with a minimum amount of conductor material in the loop. The surface coils can be mounted on a rigid mounting substrate for ease of handling and positioning. The surface coils of the present invention are particularly useful for imaging the eye of a patient.

In use, as illustrated in FIGS. 2B and 2C, a ribbon coil 21 with its support member 22 is positioned over the eye of a patient. The associated circuitry typically includes a tuning capacitor 24 for the ribbon coil 21, and a circuit for inductively coupling and actively decoupling the coil during excitation of an rf coil. The inductive coupling actively decoupling circuit comprises a loop 25 within the ribbon coil for inductive coupling, an outside loop 26, capacitors 23, and a pin diode 27 for active decoupling. Such circuits are discussed in more detail below.

Although not wishing to be bound by theory, the design of an rf surface coil in accord with the present invention is further described as follows. The design of an rf surface coil typically requires the addition of a capacitive element to resonate with the inductance of the conductor winding. In addition, a matching network generally is employed to efficiently transfer power between the surface coil and the rf electronics. The efficiency of the surface coil is ultimately limited by two factors which contribute to the resistance of the coil. One factor is the natural electrical resistance due to the conductor arrangement. Typically, the coils are made of a copper material because this material has a lower resistance than most other materials. Another factor is related to the resistive losses which occur in the sample object and couple to the surface coil. This is especially true in MRI where the sample object consists of tissue, water, and salt and, thus, can heavily "load" a coil. A measure of these resistive effects is provided by measuring the Q factor of a coil. The "unloaded" Q is measured in the absence of the sample object and provides a measure of the natural resistance of the coil. The "loaded" Q is measured in the presence of the sample object and is influenced by the combined resistance of the coil losses and the sample losses. It can be observed that volume coils at typical high-field MRI operating frequencies are dominated by the sample losses, whereas small surface coils of approximately 1" diameter and smaller exhibit considerable less loading by the sample. The consequence of this observation is that small surface coils will exhibit a better SNR if the resistance of the coil is reduced to produce higher "unloaded" Q values. For low-field MRI systems the influence of sample loading is considerably less, hence surface coils of larger diameter or size will benefit if the coil has a higher "unloaded" Q value. The present invention provides a conductor surface that achieves higher "unloaded" Q values.

Higher unloaded Q values can be obtained if the resistance of the coil can be reduced. This can be done by choosing a material of high conductivity such as copper. The resistance can also be reduced by reducing the current path length or increasing the cross-sectional area of the current path. At low frequencies, this is normally accomplished by increasing the thickness of the conductor. At high rf frequencies, rf "skin effects" occur whereby the current density only penetrates to an effective skin depth, $\delta$. Therefore, increasing the conductor thickness beyond several skin depths is not effective in reducing the resistance. The situation is actually more complicated because "proximity" effects may alter the current density further. A general rule of thumb is that the current density concentrates in the regions which are adjacent to the largest rf field strengths. For this reason, the three conductor geometries for the same type of surface coil (FIGS. 1A, 1B and 2A) lead to different experimentally measurable Q values even though the field profiles from all three coils are very similar. Experimentally, it has been determined that the conductor geometry in FIG. 1B has the lowest Q value for comparable thicknesses and widths of the conductor. This may be explained if it is considered that the current is concentrated in the inner edge of the coil because the rf magnetic field is concentrated there. The coil of FIG. 2A can achieve Q values which are higher than those of the coil of FIG. 1A.

Commercially, it is practical to build surface coils using copper traces on a substrate as in circuit board manufacturing technology. Typically, surface coils as provided by MRI manufacturers are of the FIG. 1B type. As mentioned above, this is not detrimental for volume coils but it is detrimental for small surface coils. The present invention consists of using copper traces which align the widest part of the trace parallel to the local rf magnetic field that is generated by the surface coil. In the example illustrated in FIG. 2A, the copper trace or ribbon is arranged vertically because the magnetic field is generated primarily along the axis of the coil.

Figure 3B:
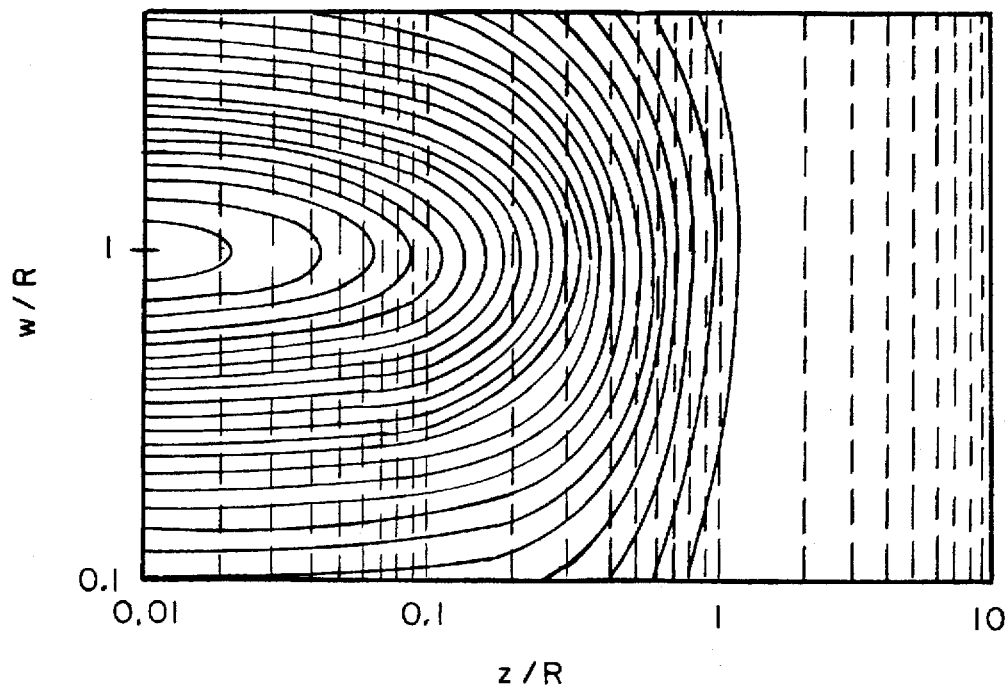
FIG. 3B is a contour plot of Q for z/R vs. w/R for the ribbon coil illustrated in FIG. 2A.

The optimum width of the copper trace may be determined by the methods described herein. The efficiency of a coil is directly related to the definition of Q as given by $$Q = \frac{\omega L}{R} = \frac{\text{power deposited in the magnetic field}}{\text{power dissipated in the resistance}} \quad (1)$$

where $\omega$ is the operating frequency in radians/sec, L the inductance of the coil, and R the resistance of the coil. Implicitly denoting the magnetic field "B" as a function of position in space, i.e., B(r), leads to a definition of Q in terms of the magnetic field as $$Q = \int \frac{\omega B^2(\vec{r})}{P} dV = \int Q(\vec{r}) dV \quad (2)$$

where P is the power applied to the probe. Q(r) is defined to be the localized Q and determines the efficiency of the probe in generating the field B(r) at the point r. For a given coil geometry and location, r, B(r) may be expressed in terms of the effective width of the coil. The above equation is then solved for the width of the coil which maximizes the localized Q(r). In general, numerical methods are necessary to determine the solution which will be dependent upon r. A simple example is illustrated by computing the function Q(z,w) for the surface coil of FIG. 2A. Z is along the axis of the surface coil (r=Z) and W is the width of the coil. Both variables may be normalized to the radius of the surface coil. The function Q(Z/R,W/R)/Q(0,1) is plotted versus width (normalized with R) of the coil in FIG. 3A illustrating that a maximum Q is achievable at different distances from the coil. The two dimensional behavior of this function is better illustrated in FIG. 3B. The behavior illustrated in FIGS. 3A and 3B is consistent with the experimentally observed higher Q values seen for FIG. 2A as compared to FIG. 1B. In general, it is noted that the optimal Q value can be approximately realized for widths which are equal to the radius of the coil. Thus, the most preferred coils in accord with the present invention have a width that is approximately equal to the radius of the coil. For non circular coils, the width is approximately equal to the radius of an equivalent circular coil.

Multi-Resonant Surface Coils

Surface coils can be made to operate at more than one frequency by replacing the capacitive element with a network equivalent to create two or more resonance modes. The disadvantage of this approach is that often one or more inductors must be incorporated whose resistive losses will add to the loss of the circuit and, thus, diminish SNR. In accord with a preferred embodiment of the present invention, a unique arrangement of the conductor for use in multiply resonant circuits is provided. Referring to FIG. 4, a segment of the conductive element 42 of a coil is subdivided into two or more parallel ribbon elements 45a, 45b ... Capacitors 46 and 47 are employed to tune the resonance modes. The inductance that is associated with each of these parallel ribbon elements can then be used to generate multiply resonant circuits. The advantage obtained by this approach is that additional inductive elements are not necessary and that conductive resistive losses are kept to a minimum.

Decoupling of Surface Coils

Often in MRI system surface coils are utilized in a receive only configuration. Another coil, typically, a whole body volume coil, is used to excite the NMR signal. The properties of the volume coil allow for a uniform excitation of the NMR signal over the region of interest. The surface coil is then used to receive the signal for improved sensitivity.

Because the surface coil is a resonant circuit, it can then be excited by the volume coil during excitation. For this reason, receive-only coils incorporate a decoupling mechanism to effectively turn them off or to detune them during the excitation process. Two mechanisms, active or passive, can be employed. Passive decoupling consists of incorporating diodes, e.g. switching diodes, across an impedance element of the surface coil. The large signal induced during excitation is then sufficient to turn on the diodes and short the impedance element. Active decoupling is implemented by incorporating an active device, such as a pin diode, across an impedance element of the coil. The device is then activated by an external signal, such as a bias current, to short out the impedance element during excitation. MRI manufacturers have generally preferred to use active decoupling methods in their products.

Conventional circuit designs for active decoupling employ the addition of several components, e.g., pin diodes, capacitors, inductors, etc. to the surface coil circuit. The addition of these components will not increase the Q value of the circuit, but will likely reduce it.

The present invention further provides a circuit design that inductively couples the decoupling effect to the surface coil. Thus, the Q value for the primary resonant circuit, which includes the surface coil, will not be reduced by the addition of extra components.

Figure 5:
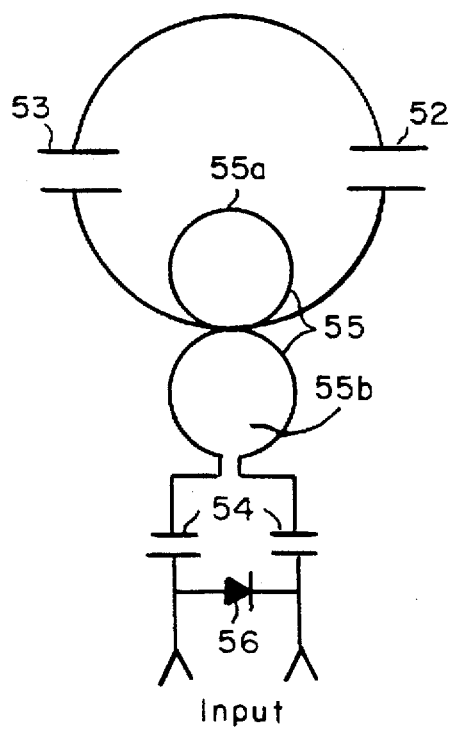
FIG. 5 illustrates a schematic circuit of an inductively coupled active decoupled surface coil design in accord with an embodiment of the present invention.

Referring to FIG. 5, in accord with one embodiment of the present invention, a surface coil consists of a large loop 52 of conductor with attached components along with its matching circuit. The larger loop 52 with attached capacitors 53 is herein referred to as the primary resonant circuit. It is inductively coupled to, but not touching, the figure eight coil 55, which with capacitors 54 is part of the matching circuit. An active component such as a pin diode 56 can be used to short the matching circuit during excitation. The resulting effect is the transformation of this short to a high impedance in the primary resonant circuit. This is the necessary effect to achieve decoupling. Because the contribution of component losses in the matching circuit is reduced by the impedance transformation ratio, the maximum sensitivity of the NMR signal is insured.

Figure 6:
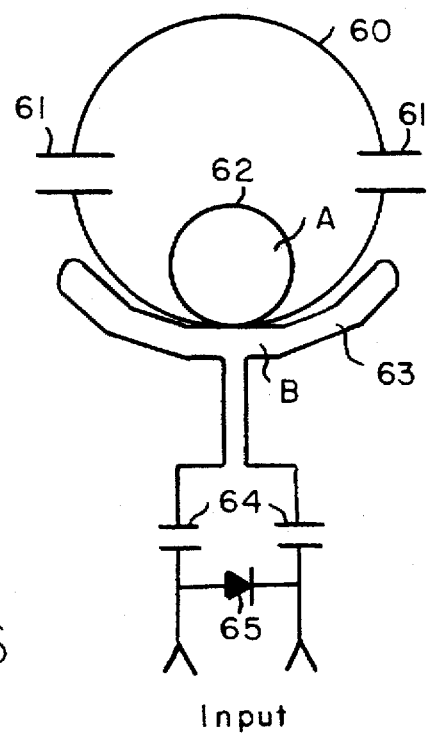
FIG. 6 illustrates a schematic circuit for an alternative design for an inductively coupled active decoupled surface coil in accord with the present invention.

A figure eight design of the coil in the matching circuit allows this coil to be transparent to the magnetic fields generated by the volume rf coil used during the excitation. It is preferred that the area of each loop, 55a and 55b, is the same to insure cancellation of any induced signals by the volume coil. To maximize the coupling to the primary resonant circuit requires that one loop of the figure eight couples to the inside area of the primary coil while the other loop of the figure eight couples to the outside area of the primary coil. Alternative designs using the above approach is shown in FIG. 6 and in FIG. 2B. Area A in the loop 62 inside coil 60 is equal to area B in the loop 63 located outside coil 60 to cancel any induced signals by the volume coil.

Figure 7A:
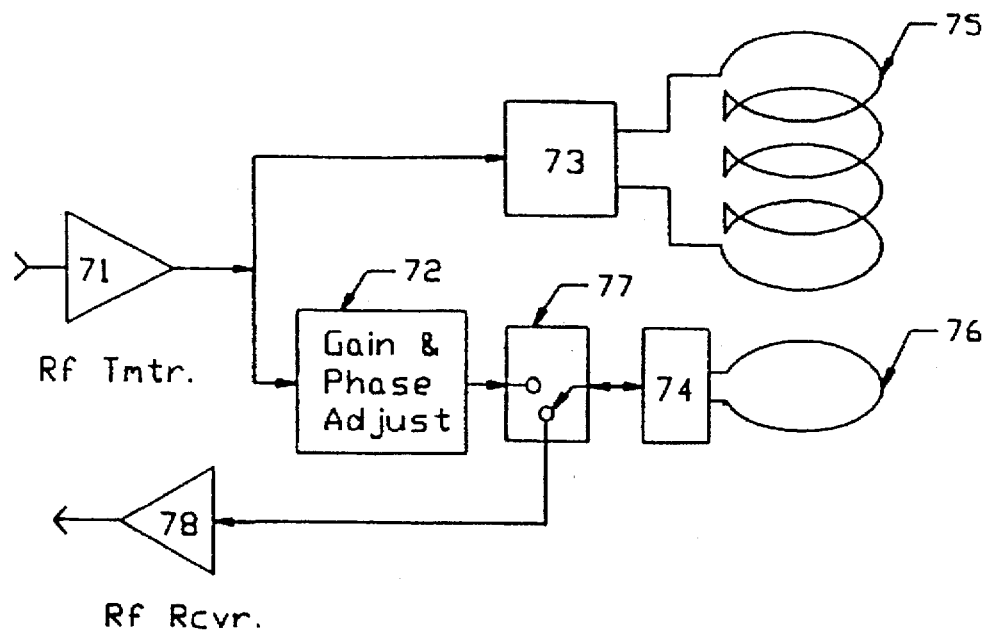
FIG. 7A illustrates a schematic circuit for an active decoupling of an inductively coupled surface coil by signal injection in accord with another embodiment of the present invention.

An alternative to the above approach, which uses a change in impedance to achieve decoupling, employs signal injection. In this approach an exact match for the rf excitation waveform is injected into the surface coil circuit, but 180 degrees out of phase, so as to exactly cancel the induced signal in the surface coil. There are several variations of this approach which can be used, as will be readily apparent to those skilled in the art. In one method, the excitation signal is split off from the transmitter and, with appropriate gain and phase shift, is then injected into the surface coil circuit. This is shown in FIG. 7A. The signal from the rf transmitter 71 is split between (i) the volume coil 75 and its matching network 73 and (ii) the surface coil 76 and its matching network 74. Before injecting the signal into the surface coil matching network 74, the amplitude and phase of the signal is appropriately adjusted by the gain and phase adjustor 72 to exactly cancel the induced signal in the surface coil. Switch 77 is used to change between excitation and receive modes of the surface coil. In the receive mode, the surface coil is connected to rf receiver 78.

Figure 7B:
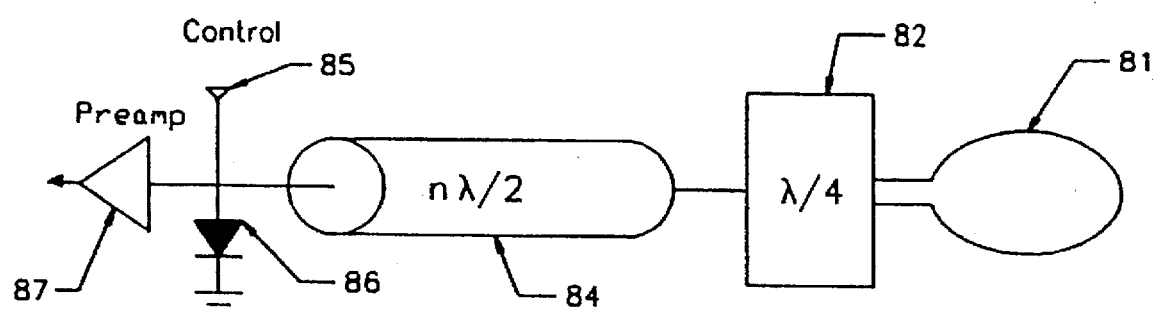
FIG. 7B illustrates a schematic circuit for decoupling of an inductively coupled surface coil by reflecting the signal from the surface coil to cancel the induced signal in accord with another embodiment of the present invention.

In another approach, the signal from the surface coil is reflected back to the surface coil with a change in phase. The concomitant result of the recombination of these waveforms is to cancel the induced signal and, hence, to decouple the surface coil. This latter approach becomes equivalent to the change in impedance method when the reflection point is brought in the vicinity of the surface coil. A diagram of this approach is schematically illustrated in FIG. 7B. As illustrated, a surface coil 81 is electrically connected to the receiver preamp through its matching network 82 and transmission path 84. The matching network provides a $\lambda/4$ phase shift and the transmission path provides an $n\lambda/2$ phase shift. A pin diode 86 when activated by a control signal 85 is used to decouple the surface coil from the MRI system during excitation of the volume coil (not shown). In the receive mode, pin diode 86 is not activated and the signal passes on to the pre-amp 87 of the rf receiver.

Manufacturers of MRI systems warn that their surface or other volume coils should not be employed within the MRI system while the surface coils are disconnected from the system. This avoids the deposit of rf energy into these coils emanating from the whole body coil during an MRI scan resulting in potential damage to the surface coils. The method of decoupling in FIG. 7B can be used to protect a surface coil when it is disconnected from the MRI system. If the phase shift is arranged to be an odd multiple of 90 degrees ($\lambda/4$) from the disconnection point, then any potentially damaging rf energy that is induced in the surface coil will be reflected back with the proper phase shift to insure sufficient decoupling of the coil.

The present invention has been described in detail including the preferred embodiments thereof. However, it is appreciated that those skilled in the art, upon considering the present disclosure including the figures, may make modifications and improvements within the spirit and scope of this invention.

What is claimed is:

1. An rf coil for MRI, said coil comprising a trace of a high conductivity material having a length, width and thickness and having a surface defined by the length and the width, the coil having a radius and a longitudinal axis at the center of the coil, wherein the trace is arranged in a loop with one end in proximity to the other end with the surface facing the inside of the loop, wherein the surface is substantially parallel to the longitudinal axis of the coil, wherein the ratio of the width of the coil to the radius of the coil is 0.3 or greater, and wherein the thickness of the trace is sufficient to provide an rf skin effect, wherein said trace is mounted on a mounting substrate with said surface perpendicular to said mounting substrate.

2. The rf coil as set forth in claim 1, wherein said trace is formed on a flexible substrate.

3. The rf coil as set forth in claim 1, wherein said high conductivity material is copper.

4. The rf coil as set forth in claim 1, wherein the ratio of the width of the coil to the radius of the coil is 0.5 or greater.

5. The rf coil as set forth in claim 1, wherein the ratio of the width of the coil to the radius of the coil is about 1.

6. The rf coil as set forth in claim 1, wherein the coil has a radius of from about 1.0 cm to about 2.5 cm.

7. A method for performing magnetic resonance imaging, said method comprising providing a rf coil mounted in proximity to the surface of a volume being examined, said rf coil comprising a trace of a high conductivity material having a length, width and thickness and having a coil surface defined by the length and the width, the coil having a radius and a longitudinal axis at the center of the coil, wherein the trace is arranged in a loop with one end in proximity to the other end with the surface facing the inside of the loop, wherein the coil surface is substantially parallel to the longitudinal axis of the coil, wherein the ratio of the width of the coil to the radius of the coil is 0.3 or greater, and wherein the thickness of the trace is sufficient to provide an rf skin effect, the coil being mounted with the axis perpendicular to the surface of the volume being examined.

* * * * *